United States Patent
Cho

(10) Patent No.: US 7,222,273 B2
(45) Date of Patent: May 22, 2007

(54) APPARATUS AND METHOD FOR TESTING SEMICONDUCTOR MEMORY DEVICES, CAPABLE OF SELECTIVELY CHANGING FREQUENCIES OF TEST PATTERN SIGNALS

(75) Inventor: Sung-bum Cho, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 306 days.

(21) Appl. No.: 10/886,074

(22) Filed: Jul. 7, 2004

(65) Prior Publication Data

US 2005/0050409 A1   Mar. 3, 2005

(30) Foreign Application Priority Data

Aug. 25, 2003  (KR) .................. 10-2003-0058777

(51) Int. Cl.
*G11C 29/00* (2006.01)
*G11C 7/00* (2006.01)
(52) U.S. Cl. ...................... 714/720; 365/201
(58) Field of Classification Search ............... 714/724, 714/733, 728, 738, 739, 720; 365/201
See application file for complete search history.

(56) References Cited

U.S. PATENT DOCUMENTS 6,901,546 B2 * 5/2005 Chu et al. .................... 714/738
6,917,215 B2 * 7/2005 Ichikawa .................... 324/765

FOREIGN PATENT DOCUMENTS

| JP | 10062504 A | * | 8/1996 |
| JP | 02000091390 A | * | 3/2000 |
| WO | 01/95339 A2 | | 12/2001 |

* cited by examiner

*Primary Examiner*—Cynthia Britt
(74) *Attorney, Agent, or Firm*—Mills & Onello, LLP

(57) ABSTRACT

There are provided an apparatus and method for testing semiconductor memory devices, in which the frequencies of test pattern signals can be selectively changed. The test apparatus includes a main tester, an input frequency converter, and an output frequency converter. The main tester generates first input test signals with a first frequency, a first program control signal, and a second program control signal, receives first output test pattern signals with the first frequency, and determines an operating performance of a semiconductor memory device. The input frequency converter converts the first input test pattern signals into second input test pattern signals with a second frequency in response to the first program control signal, and applies the second input test pattern signals to the semiconductor memory device. The output frequency converter converts the second output test pattern signals with the second frequency received from the semiconductor memory device into the first output test pattern signals in response to the second program control signal and outputs the first output test pattern signals. The test apparatus and method can test semiconductor memory devices with a high operating frequency by selectively changing the frequencies of test pattern signals.

21 Claims, 11 Drawing Sheets

APPARATUS AND METHOD FOR TESTING SEMICONDUCTOR MEMORY DEVICES, CAPABLE OF SELECTIVELY CHANGING FREQUENCIES OF TEST PATTERN SIGNALS

BACKGROUND OF THE INVENTION

This application claims the priority of Korean Patent Application No. 2003-58777, filed on Aug. 25, 2003, in the Korean Intellectual Property Office, the contents of which are incorporated herein in their entirety by reference.

FIELD OF THE INVENTION

The present invention relates to an apparatus for testing semiconductor devices, and more particularly, to an apparatus for testing semiconductor memory devices and a method for using the same.

DESCRIPTION OF THE RELATED ART

Semiconductor memory devices are generally subjected to testing before they are sold. The testing of the semiconductor memory devices includes three different tests: a DC parametric test, a dynamic functional test, and an AC parametric test.

In the DC parametric test, DC characteristics such as a source current, a leakage current, and output voltage characteristics of a semiconductor memory device are verified. In the dynamic functional test, it is determined whether a semiconductor memory device performs predetermined operations correctly when actually operating. In the AC parametric test, AC characteristics of a semiconductor memory device, that is, time-dependent parameters of a semiconductor memory device, are measured.

The dynamic functional test is performed under normal operating conditions of the semiconductor memory device. In the dynamic functional test, a test apparatus generates pattern signals, outputs the pattern signals to the semiconductor memory device to be tested, compares signals output from the semiconductor memory device with reference signals, and determines whether the semiconductor memory device is operating correctly. A conventional test apparatus for testing semiconductor memory devices is disclosed in U.S. Pat. No. 5,978,949.

FIG. 1 is a block diagram of a conventional test apparatus 101 and a semiconductor memory device 102. The test apparatus 101 includes a test signal generator 110 and a defect analyzer 120. The test signal generator 110 includes a first timing generator 111, a first algorithmic pattern generator (ALPG) 112, a format controller 113, a driver 114, and a first reference voltage generator 115. The defect analyzer 120 includes a comparator 121, a second reference voltage generator 122, a digital comparator 123, a second timing generator 124, a second ALPG 125, and a memory 126. Output terminals of the driver 114 are respectively connected one-to-one to the input terminals of the semiconductor memory device 102, and the output terminals of the semiconductor memory device 102 are respectively connected to input terminals of the comparator 121.

The driver 114 of the test signal generator 110 generates a plurality of pattern signals DR1 through DRN (N is an integer greater than two) and outputs the plurality of pattern signals DR1 through DRN to the semiconductor memory device 102. Then, the semiconductor memory device 102 outputs a plurality of signals CP1 through CPN to the comparator 121 of the defect analyzer 120, in response to the plurality of pattern signals DR1 through DRN. The defect analyzer 120 compares the plurality of signals CP1 through CPN with predetermined reference signals and stores the compared result in the memory 126.

The conventional test apparatus 101 can test semiconductor memory devices with a relatively low operating frequency of 250 MHz with a bus throughput of 500 Mbps. However, as high-frequency semiconductor memory devices are being developed, a test apparatus capable of testing such high-frequency semiconductor memory devices is required. Existing test systems can test semiconductor memory devices with operating frequencies up to 500 MHz with a bus throughput of 1 Gbps. Therefore, conventional test systems cannot determine operation characteristics of semiconductor memory devices with higher operating frequencies.

SUMMARY OF THE INVENTION

The present invention provides an apparatus and method for testing a semiconductor memory device with a high operating frequency by selectively changing the frequencies of test pattern signals.

According to an aspect of the present invention, there is provided an apparatus for testing a semiconductor memory device comprising a main tester, an input frequency converter, and an output frequency converter.

The main tester generates a plurality of first input test pattern signals with a first frequency, a first program control signal, and a second program control signal, receives a plurality of first output test pattern signals with the first frequency, and detects an operating performance of a semiconductor memory device. The input frequency converter converts the first input test pattern signals into a plurality of second input test pattern signals with a second frequency in response to the first program control signal, and outputs the second input test pattern signals to the semiconductor memory device. The output frequency converter converts a plurality of second output test pattern signals with the second frequency received from the semiconductor memory device into the first output test pattern signals in response to the second program control signal and outputs the first output test pattern signals.

In one embodiment, the first input test pattern signals are first parallel data signals and the second input test pattern signals are first serial data signals, the input frequency converter includes a plurality of input signal converters, each of which receives a predetermined number of the first parallel data signals and outputs one of the first serial data signals, the first output test pattern signals are second parallel data signals and the second output test pattern signals are second serial data signals, and the output frequency converter includes a plurality of output signal converters, each of which receives one of the second serial data signals and outputs a predetermined number of the second parallel data signals. Each of the plurality of input signal converters can comprise: a control register, which is programmed in response to the first program control signal and outputs first and second control signals; a serial converter, which is enabled or disabled in response to the first control signal, converts the predetermined number of the first parallel data signals into the one of the first serial data signals when the serial converter is enabled, and outputs one of the first serial data signals; and a first delay device, which sets a first delay time in response to the second control signal, delays the one of the first serial data signals by the first delay time, and outputs the delayed one of the first serial data signals. The first delay times of the first delay devices are not necessarily set the same for all of input signal converters. The control register can further output a third control signal, and each of the input signal converters can further include a second delay device that sets a second delay time in response to the third control signal, delays the delayed one of the first serial data signals by the second delay time, and outputs the twice delayed one of the first serial data signals. The second delay time of the second delay device can be equal for all of the input signal converters. The number of the first parallel data signals to be input to each of the input signal converters can be determined according to a frequency of the first parallel data signals and an operating frequency of the semiconductor memory device to be tested. The first program control signal can include an identification signal for each of the input signal converters.

In one embodiment, each of the plurality of output signal converters comprises: a control register, which is programmed in response to the second program control signal and outputs first and second control signals; a first delay device, which sets a first delay time in response to the second control signal, delays the one of the second serial data signals by the first delay time, and outputs the delayed one of the second serial data signals; and a parallel converter, which is enabled or disabled in response to the first control signal, converts the one of the second serial data signals received from the first delay device into a predetermined number of the second parallel data signals when the parallel converter is enabled, and outputs the converted result.

In one embodiment, the first delay times of the first delay devices are not necessarily the same for all of output signal converters. The control register can further output a third control signal, and each of the input signal converters can further include a second delay device that sets a second delay time in response to the third control signal, delays the delayed one of the second serial data signals by the second delay time, and outputs the twice delayed one of the second serial data signals. In one embodiment, the second delay time of the second delay device is equal for all of the output signal converters. In one embodiment, the number of the second parallel data signals to be output from each of the output signal converters is determined according to a frequency of the second parallel data signals and an operating frequency of the semiconductor memory device to be tested. In one embodiment, the second program control signal includes an identification signal for each of the output signal converters.

In one embodiment, the main tester comprises: a test signal generator, which generates the first input test pattern signals; a defect analyzer, which receives the first output test pattern signals and detects the operating performance of the semiconductor memory device; a logic signal generator, which generates a first logic signal and a second logic signal; a first controller, which outputs the first program control signal in response to the first logic signal; and a second controller, which outputs the second program control signal in response to the second logic signal. In one embodiment, the first controller and the second controller are mode register set signal generators. In one embodiment, the first controller and the second controller are CMOS signal generators. According to another aspect of the present invention, there is provided a test apparatus for testing a plurality of semiconductor memory devices, the apparatus comprising a main tester, a plurality of input frequency converters, and a plurality of output frequency converters.

The main tester generates a plurality of first input test pattern signals with a first frequency, a first program control signal and a second program control signal, receives a plurality of first output test pattern signals with the first frequency, and determines operating performances of semiconductor memory devices. The input frequency converters convert the first input test pattern signals into a plurality of second input test pattern signals with a second frequency in response to the first program control signal, and output the second input test pattern signals to corresponding semiconductor memory devices. The input frequency converters are simultaneously enabled in response to the first program control signal. The output frequency converters convert a plurality of second output test pattern signals with the second frequency received from the semiconductor memory devices into the first output test pattern signals in response to the second program control signal, and output the first output test pattern signals. When one of the output frequency converters is enabled in response to the second program control signal, the remaining output frequency converters are disabled.

According to still another aspect of the present invention, there is provided a method of testing a semiconductor memory device comprising: (a) determining a number of first input test pattern signals to be generated; (b) connecting a main tester, a input frequency converter, and an output frequency converter, according to the determined number of the first input test pattern signals; (c) generating a first program control signal and a second program control signal and setting first output delay times of the input frequency converter and the output frequency converter; (d) connecting the semiconductor memory device between the input frequency converter and the output frequency converter; and (e) generating the first input test pattern signals, receiving first output test pattern signals, and determining an operating performance of the semiconductor memory device.

According to still yet another aspect of the present invention, there is provided a method of testing a plurality of semiconductor memory devices comprising: (a) determining a number of first input test pattern signals to be generated; (b) connecting a main tester, input frequency converters and output frequency converters by external data lines according to the determined number of the first input test pattern signals; (c) generating a first program control signal and a second program control signal and setting first output delay times of the input frequency converters and the output frequency converters; (d) connecting the semiconductor memory devices between the respective input frequency converters and output frequency converters; and (e) generating the first input test pattern signals, receiving first output test pattern signals, and determining an operating performance of each of the semiconductor memory devices.

In one embodiment, step (e) comprises: (e1) generating the first program control signal, thereby enabling all of the input frequency converters; (e2) inputting the first input test pattern signals to the input frequency converters; (e3) generating the second program control signal, thereby enabling the output frequency converters individually; (e4) receiving the first output test pattern signals from the enabled output frequency converter and determining an operating performance of a corresponding semiconductor memory device; and (e5) repeating steps (e3) and (e4) until all semiconductor memory devices are tested.

BRIEF DESCRIPTION OF THE DRAWINGS

The foregoing and other features and advantages of the invention will be apparent from the more particular description of an embodiment of the invention, as illustrated in the accompanying drawing. The drawing is not necessarily to scale, emphasis instead being placed upon illustrating the principles of the invention.

DETAILED DESCRIPTION OF THE INVENTION

Figure 1:
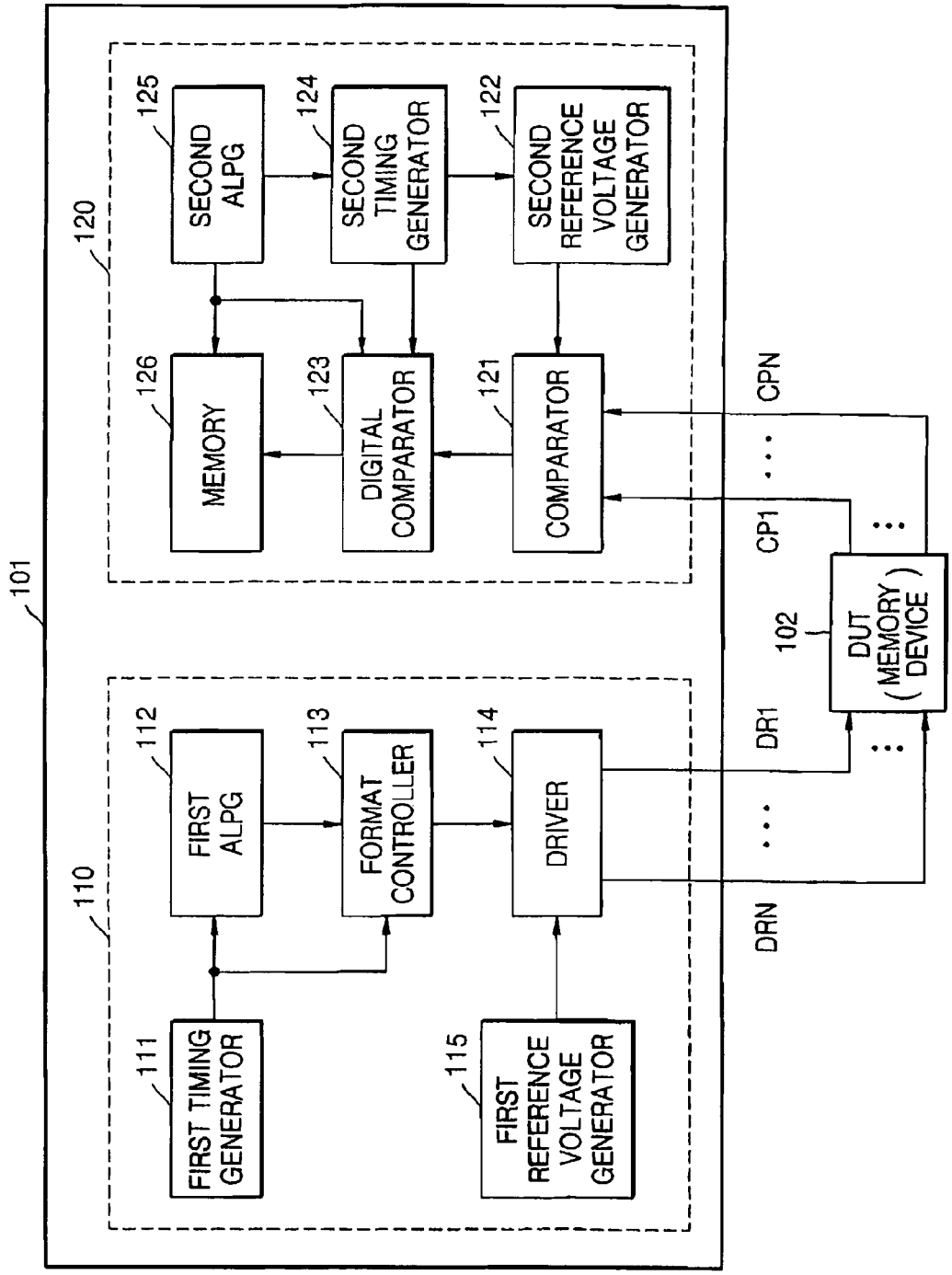
FIG. 1 is a block diagram of a conventional test apparatus and a semiconductor memory device.
Figure 2:
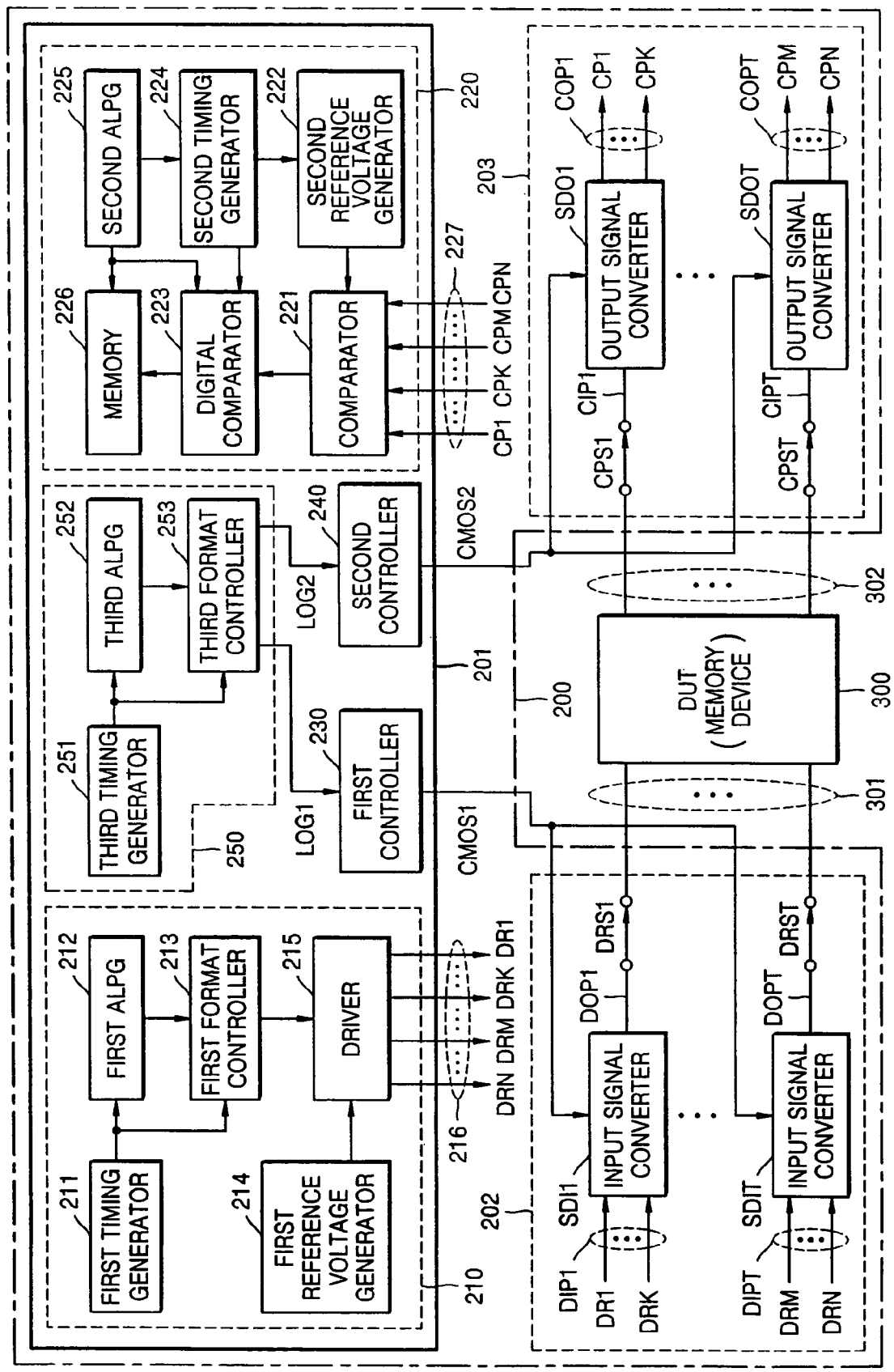
FIG. 2 is a block diagram of an apparatus that tests a semiconductor memory, according to a first embodiment of the present invention, and a semiconductor memory device.

FIG. 2 is a block diagram of a test apparatus 200 and a semiconductor memory device 300 according to a first embodiment of the present invention. The test apparatus 200 includes a main tester 201, an input frequency converter 202, and an output frequency converter 203. Output pins 216 of the main tester 201 are connected to input pins DIP1 through DIPT (T is an integer greater than one) of the input frequency converter 202. Also, the input pins 227 of the main tester 201 are connected to output pins COP1 through COPT of the output frequency converter 203.

The input frequency converter 202 and the output frequency converter 203 can be separated from the main tester 201. Also, the input frequency converter 202 and the output frequency converter. 203 can be included in a single chip.

A high-frequency memory device 300 to be tested is connected between the input frequency converter 202 and the output frequency converter 203. That is, output pins DOP1 through DOPT of the input frequency converter 202 are connected to input pins 301 of the semiconductor memory device 300, respectively, and input pins CIP1 through CIPT of the output frequency converter 203 are connected to output pins 302 of the semiconductor memory device 300, respectively.

The main tester 201 includes a test signal generator 210, a defect analyzer 220, a first controller 230, a second controller 240, and a logic signal generator 250.

The test signal generator 210 includes a first timing generator 211, a first ALPG 212, a first format controller 213, a first reference voltage generator 214, and a driver 215. The defect analyzer 220 includes a comparator 221, a second reference voltage generator 222, a digital comparator 223, a second timing generator 224, a second ALPG 225, and a memory 226. The logic signal generator 250 includes a third timing generator 251, a third ALPG 252, and a third format controller 253.

In FIG. 2, it is shown that the first ALPG 212, the second ALPG 225, and the third ALPG 252 are separated from one another, in order to facilitate the understanding of the operations of the main tester 201. Likewise, it is shown that the first timing generator 211, the second timing generator 224, and the third timing generator 251 are separated from one another, in order to facilitate the understanding of the operations of the main tester 201.

The first timing generator 211 generates a first clock signal. A test period is determined by the period of the first clock signal. The first ALPG 212 generates pre-programmed logic data signals in synchronization with the first clock signal. The first format controller 213 outputs the logic data signals output from the first ALPG 212 to the driver 215 in synchronization with the first clock signal. The driver 215 amplifies the logic data signals to have an amplitude equal to a first reference voltage generated by the first reference voltage generator 214, and outputs a plurality of parallel data signals DR1 through DRK, . . . , DRM through DRN (K and M are integers greater than two with N=M+(K−1)) as test pattern signals.

The third timing generator 251 generates a third clock signal. The third ALPG 252 generates pre-programmed logic data signals in synchronization with the third clock signal. The third format controller 253 receives the logic data signals output from the third ALPG 252 and outputs a first logic signal LOG1 and a second logic signal LOG2 in synchronization with the third clock signal.

The first controller 230 controls the input frequency converter 202 in response to the first logic signal LOG1, and the second controller 240 controls the output frequency converter 203 in response to the second logic signal LOG2.

The first controller 230 and the second controller 240 can be mode register set signal generators or CMOS signal generators. When the first controller 230 and the second controller 240 are mode register set signal generators, mode register set signals MRS1 and MRS2 are output respectively to the input frequency converter 202 and the output frequency converter 203, and when the first controller 230 and the second controller 240 are CMOS signal generators, first and second CMOS signals CMOS1 and CMOS2, each including a clock signal SCK, a command signal CMD and a data signal SIO, are output to the input frequency converter 202 and the output frequency converter 203, respectively.

Referring to FIG. 2, a case where the first controller 230 and the second controller 240 are CMOS signal generators will is described. The first controller 230 and the input signal converters SDI1 through SDIT are connected by one line. However, the first controller 230 and the input signal converters SDI1 and SDIT can be connected through a plurality of lines each transmitting the clock signal SCK, the command signal CMD, and the data signal SIO as the CMOS signal CMOS1. Similarly, the second controller 240 and the output signal converters SDO1 through SDOT can be connected through a plurality of lines.

The input frequency converter 202 includes a plurality of input signal converters SDI1 through SDIT. Each of the plurality of input signal converters SDI1 through SDIT is initialized in response to the first CMOS signal CMOS1 and the output delay of each of the input signal converters SDI1 through SDIT is set by the first CMOS signal CMOS1.

The output frequency converter 203 includes a plurality of output signal converters SDO1 through SDOT. Each of the output signal converters SDO1 through SDOT is initialized by the second CMOS signal CMOS2 and the output delay of each of the output signal converters SDO1 through SDOT is set by the second CMOS signal CMOS2.

The input signal converters SDI1 through SDIT receive the parallel data signals DR1 through DRK, ..., DRM through DRN, and output serial data signals DRS1 through DRST, respectively. For example, the input signal converter SDI1 converts the parallel data signals DR1 through DRK into the serial data signal DRS1 and outputs the serial data signal DRS1.

Here, the frequencies of the serial data signals DRS1 through DRST can depend on the number of the parallel data signals DR1 through DRK, ..., DRM through DRN input to each of the input signal converters SDI1 through SDIT.

For example, it is assumed that the main tester 201 outputs the plurality of parallel data signals DR1 through DRK, ..., DRM through DRN with a frequency of 250 MHz. Then, when 20 parallel data signals DR1 through DR20, ..., DRM through DR(M+19) are input to each of the input signal converters SDI1 through SDIT, the input signal converters SDI1 through SDIT output serial data signals DRS1 through DRST at 2.5 GHz.

Also, when 10 parallel data signals DR1 through DR10, ..., DRM through DR(M+9) are input to each of the input signal converters SDI1 through SDIT, the input signal converters SDI1 through SDIT output serial data signals DRS1 through DRST at 2.5 GHz.

As described above, the input signal converters SDI1 through SDIT convert the parallel data signals DR1 through DRK, ..., DRM through DRN with a low frequency into serial data signals DRS1 through DRST with a high frequency.

The plurality of serial data signals DRS1 through DRST are respectively input to the input pins 301 of the semiconductor memory device 300. The semiconductor memory device 300 outputs the serial data signals CPS1 through CPST through the output pins 302, in response to the serial data signals DRS1 through DRST.

The output signal converters SDO1 through SDOT respectively convert the high-frequency serial data signals CPS1 through CPST output from the output pins 302 into low-frequency parallel data signals CP1 through CPK, ..., CPM through CPN. Each of the output signal converters SDO1 through SDOT output the same number of parallel data signals as the number of input signals input to each of the input signal converters SDI1 through SDIT. For example, the output signal converter SDO1 converts the serial data signal CPS1 into the plurality of parallel data signals CP1 through CPK. If the input signal converter SDI1 receives 10 parallel data signals DR1 through DR10, the output signal converter SDO1 also outputs 10 parallel data signals CP1 through CP10. As a result, the low-frequency parallel data signals CP1 through CPK, ..., CPM through CPN are input to the comparator 221.

The comparator 221 compares the parallel data signals CP1 through CPK, ..., CPM through CPN with a second reference voltage and outputs results of the comparison. The second reference voltage is generated by the second reference voltage generator 222. The digital comparator 223 compares the output signals of the comparator 221 with logic data signals output from the second ALPG 225 in synchronization with the second clock signal, and stores results of the comparison in the memory 226. The memory 226 stores the signals output by the digital comparator 223 in response to an address signal generated by the second ALPG 225.

The plurality of input signal converters SDI1 through SDIT will now be described in more detail with reference to FIGS. 3A and 3B.

Figure 3A:
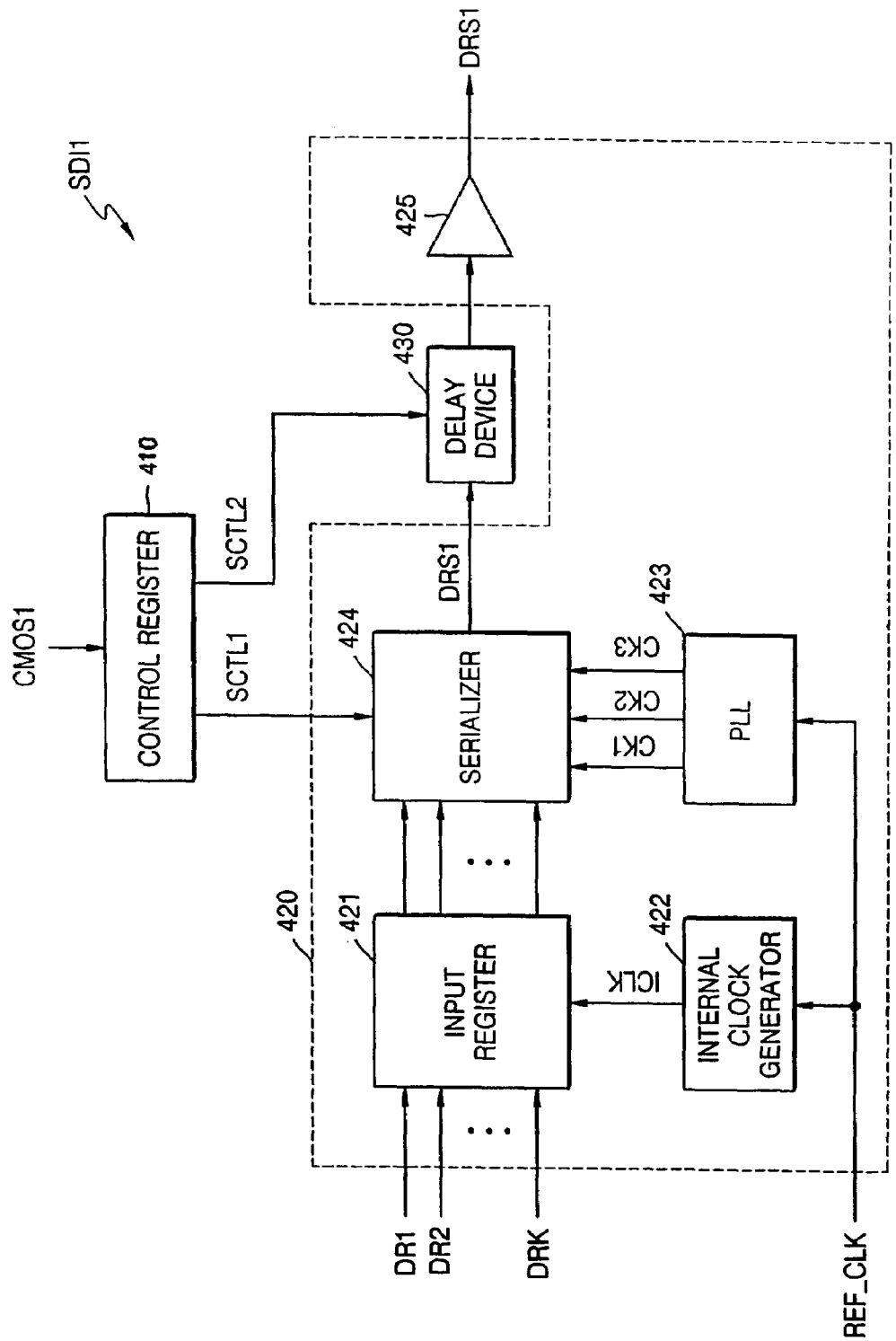
FIG. 3A is a block diagram of an input signal conversion unit according to a second embodiment of the present invention.
Figure 3B:
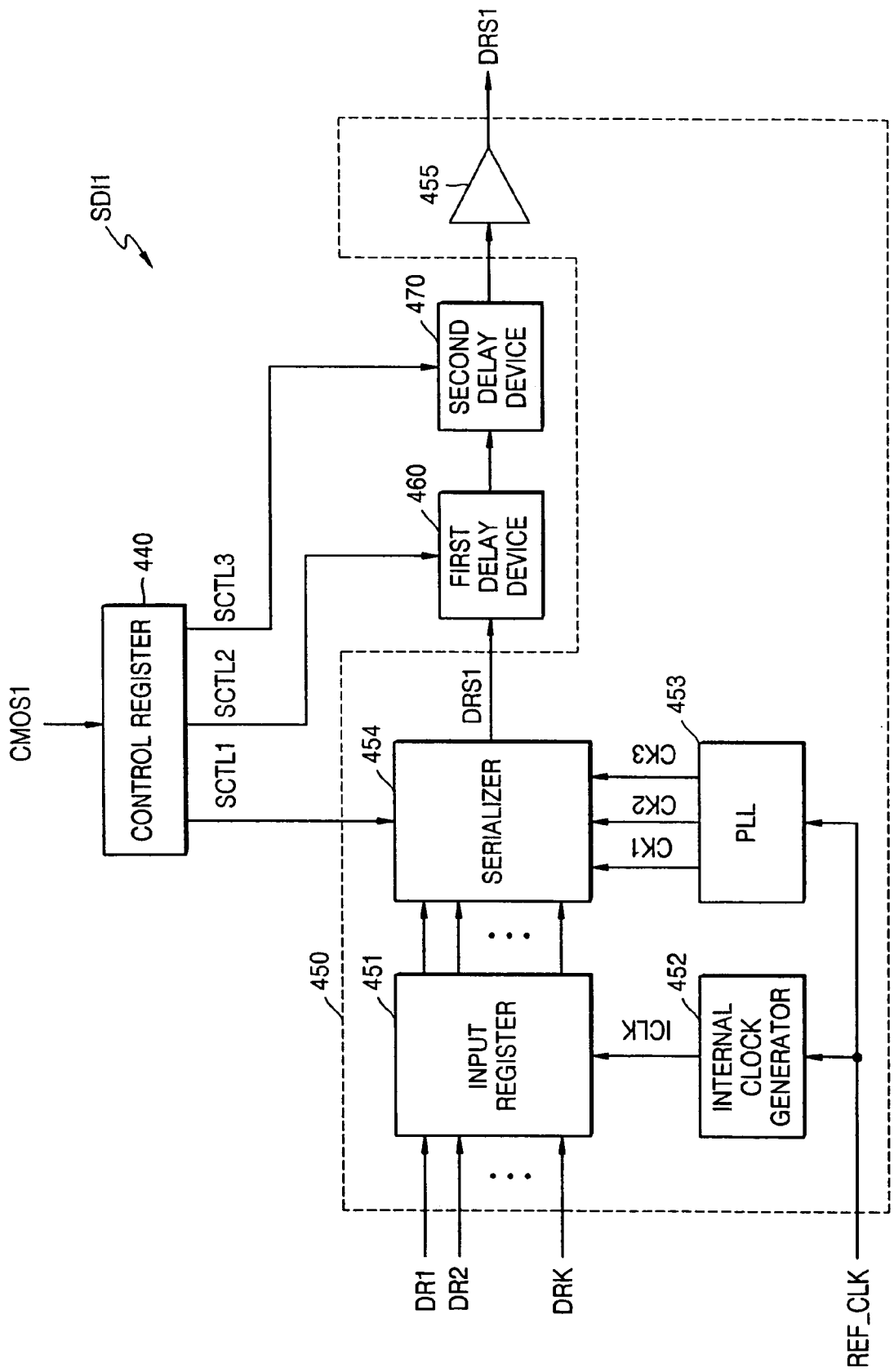
FIG. 3B is a block diagram of an input signal conversion unit according to a third embodiment of the present invention.

FIG. 3A is a block diagram of an input signal conversion unit according to a second embodiment of the present invention, and FIG. 3B is a block diagram showing an input signal conversion unit according to a third embodiment of the present invention. In FIGS. 3A and 3B, the input signal converter SDI1 is shown, however, the input signal converters SDI2 through SDIT are implemented in the same manner as the input signal converter SDI1.

Referring to FIG. 3A, the input signal converter SDI1 includes a control register 410, a serial converter 420, and a delay device 430. The serial converter 420 includes an input register 421, an internal clock generator 422, a phase locked loop (PLL) 423, a serializer 424, and an output buffer 425. The control register 410 is programmed by the first CMOS signal CMOS1 received from the first controller 230 and outputs a plurality of control signals SCTL1 and SCLT2.

The input register 421 receives a plurality of parallel data signals DR1 through DRK from the driver 215, temporally stores the signals, and outputs the plurality of parallel data signals DR1 through DRK in response to an internal clock signal ICLK, which is generated by the internal clock generator 422 in response to a reference clock signal REF_CLK.

The PLL 423 receives the reference clock signal REF_CLK and generates a plurality of clock signals CK1 through CK3. The serializer 424 is enabled or disabled in response to the control signal SCTL1. The serializer 424 receives the plurality of parallel data signals DR1 through DRK from the input register 421, and converts the plurality of parallel data signals DR1 through DRK into a serial data signal DRS1 in response to the plurality of clock signals CK1 through CK3.

That is, the serializer 424 converts the plurality of parallel data signals DR1 through DRK with a low frequency, such as 100 MHz, into the serial data signal DRS1 with a high frequency, such as 1.5 GHz. The output buffer 425 outputs the serial data signal DRS1 to the input pins 301 of a semiconductor memory device.

The delay device 430 is connected between the serializer 424 and the output buffer 425. The delay device 430 sets a delay time in response to the control signal SCTL2 and delays and outputs the serial data signal DRS1 by the set delay time.

The delay device 430 compensates for skews between the serial data signal DRS1 and serial data signals DRS2 through DRST output from the input signal converters SDI2 through SDIT.

More specifically, traces formed on a PCB, to respectively connect the input signal converters SDI1 through SDIT with the input pins 301 of the semiconductor memory device have different lengths. As a result, times at which the serial data signals DRS1 through DRST are respectively input to the input pins 301 of the semiconductor memory device are different from one another. Such skews between the serial data signals DRS1 through DRST are compensated for by adjusting the delay time of the delay devices 430 of each of the input signal converters SDI1 through SDIT.

That is, if the delay time of the delay device 430 of each of the input signal converters SDI1 through SDIT is adjusted according to the lengths of the respective traces, the serial data signals DRS1 through DRST can be simultaneously input to the semiconductor memory device 300. Accordingly, the skews between the serial data signals DRS1 through DRST are compensated for by the delay device 430.

Referring to FIG. 3B, the input signal converter SDI1 includes a control register 440, a serial converter 450, a first delay device 460, and a second delay device 470. The serial converter 450 includes an input register 451, an internal clock generator 452, a PLL 453, a serializer 454, and an output buffer 455. The input signal converter SDI1 of FIG. 3B is implemented in the same manner as the input signal converter SDI1 of FIG. 3A except for two differences. A detailed description for the configuration and operation of the input signal converter of FIG. 3B is omitted except for the two differences.

A first difference is that the control register 440 further outputs a control signal SCTL3. A second difference is that the input signal converter SDI1 includes the first delay device 460 and the second delay device 470.

The first delay device 460 and the second delay device 470 are connected in series between the serializer 454 and the output buffer 455. The first delay device 460 sets a first delay time in response to the control signal SCTL2, and the second delay device 470 sets a second delay time in response to the control signal SCTL3. The first delay device 460 delays the serial data signal DRS1 received from the serializer 454 by the first delay time. Here, the first delay device 460 performs the same function as the delay device 430 of FIG. 3A. Accordingly, the detailed description for the operation of the first delay device 460 is omitted.

The second delay device 470 delays the delayed serial data signal DRS1 received from the first delay device 460 by the second delay time.

Here, the second delay times of the second delay device 470 of each of the input signal converters SDI1 through SDIT are all equal and can be changed as necessary. As a result, the times at which the serial data signals DRS1 through DRST are respectively input to the input pins 301 of the semiconductor memory device 300, become faster or are delayed by the second delay device 470. Accordingly, as the second delay time is changed, a valid data margin on the input side of the semiconductor memory device 300 can be estimated.

Figure 4A:
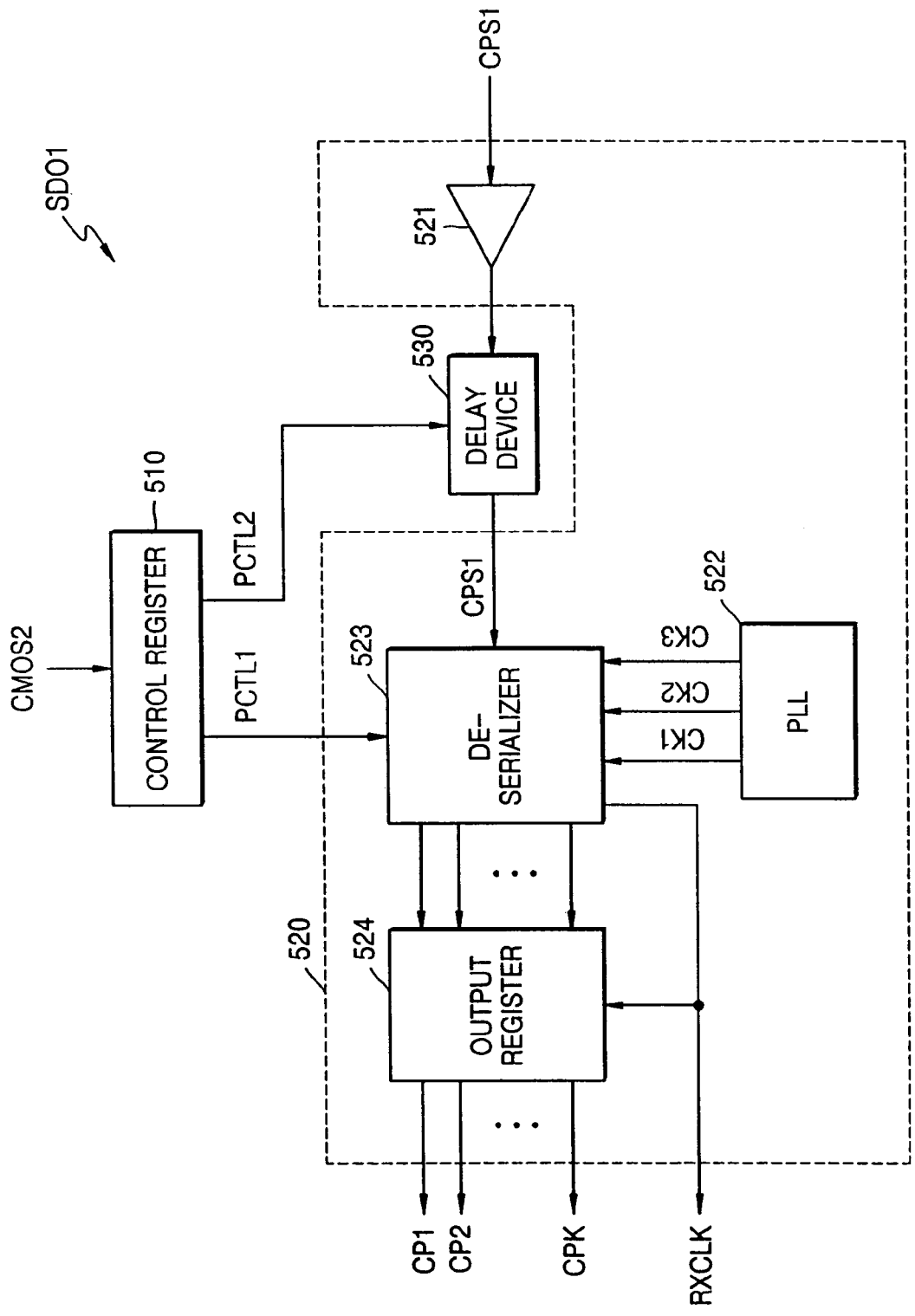
FIG. 4A is a block diagram of an output signal conversion unit according to a fourth embodiment of the present invention.

Next, referring to FIGS. 4A and 4B, the plurality of output signal converters SDO1 through SDOT will be described in more detail. FIG. 4A is a block diagram of an output signal conversion unit according to a fourth embodiment of the present invention, and FIG. 4B is a block diagram of an output signal conversion unit according to a fifth embodiment of the present invention.

Figure 4B:
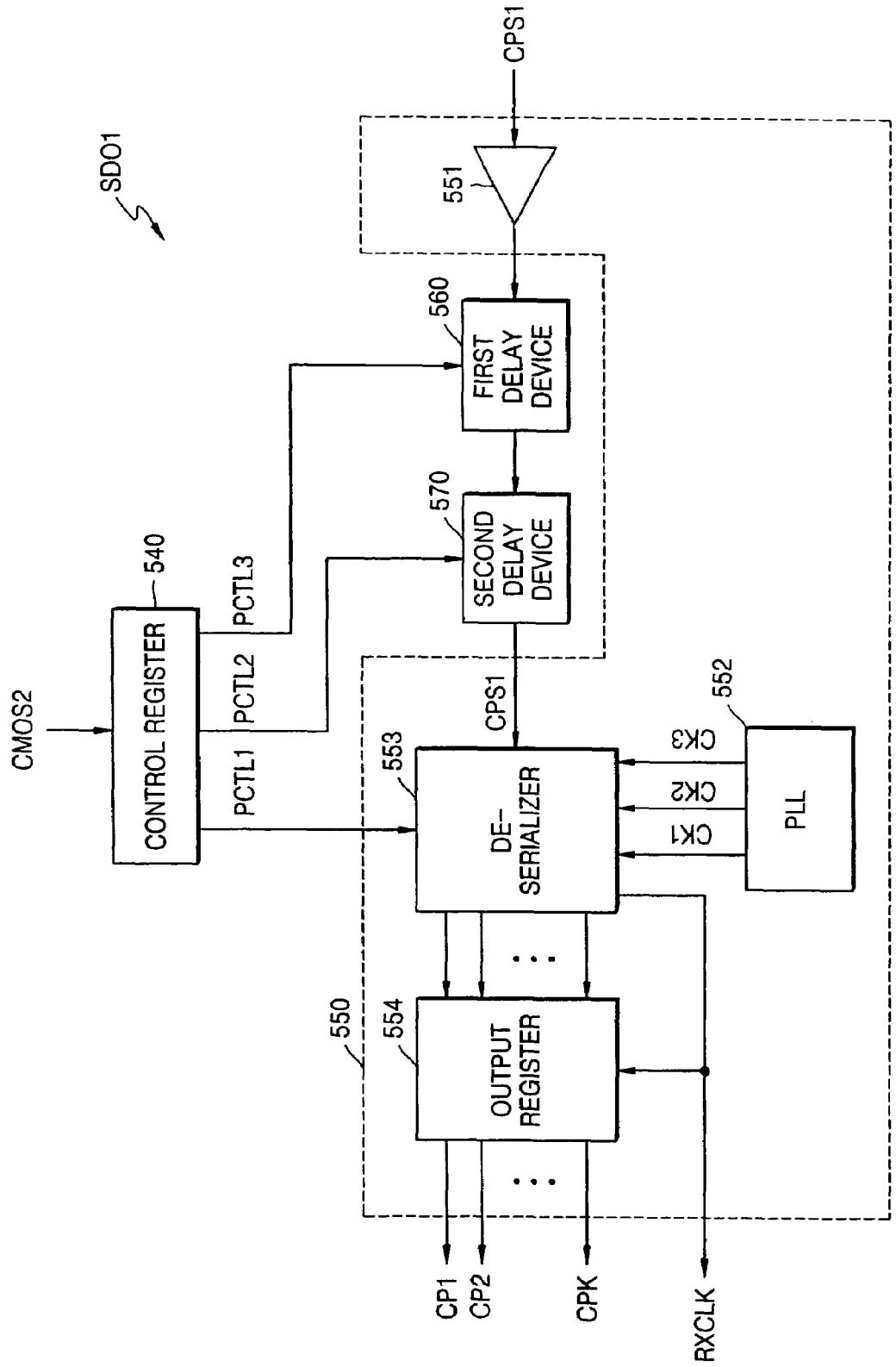
FIG. 4B is a block diagram of an output signal conversion unit according to a fifth embodiment of the present invention.

In FIGS. 4A and 4B, the output signal converter SDO1 is shown, however, the output signal converters SDO2 through SDOT are implemented in the same manner as the output signal converter SDO1.

Referring to FIG. 4A, the output signal converter SDO1 includes a control register 510, a parallel converter 520, and a delay device 530. The parallel converter 520 includes an input buffer 521, a PLL 522, a de-serializer 523, and an output register 524.

The control register 510 is programmed by a CMOS signal CMOS2 received from the second controller 240 and outputs a plurality of control signals PCTL1 and PCTL2. The input buffer 521 receives a serial data signal CPS1 from the output pins 302 of the semiconductor memory device.

The delay device 530 is connected between the input buffer 521 and the de-serializer 523. The delay device 530 sets a delay time in response to the control signal PCTL2 and delays the serial data signal CPS1 by the delay time.

The delay device 530 compensates for skews between the serial data signal CPS1 and serial data signals CPS2 through CPST input to the other output signal converters SDO2 through SDOT.

More specifically, traces formed on a PCB, to respectively connect the output signal converters SDO1 through SDOT with the output pins 302 of the semiconductor memory device, have different lengths. As a result, the times at which the serial data signals CPS1 through CPST are respectively input to the respective de-serializers 523 of the output signal converters SDO1 through SDOT are different from one another.

Such skews between the serial data signals CPS1 through CPST are compensated for by adjusting the delay times of the respective delay devices 530 of the output signal converters SDO1 through SDOT.

That is, if the delay times of the respective delay devices 530 of the output signal converters SDO1 through SDOT are controlled according to the respective trace lengths, the serial data signals CPS1 through CPST can be simultaneously input to the respective de-serializers 523 of the output signal converters SDO1 through SDOT. Accordingly, the skews between the serial data signals CPS1 through CPST are compensated for by the delay device 530.

The de-serializer 523 is enabled or disabled in response to the control signal PCTL1. The de-serializer 523 receives the serial data signal CPS1 from the delay device 530 and converts the serial data signal CPS1 into a plurality of parallel data signals CP1 through CPK in response to a plurality of clock signals CK1 through CK3.

More specifically, the de-serializer 523 converts the serial data signal CPS1 with a high frequency, such as 1.5 GHz, into the plurality of parallel data signals CP1 through CPK with a low frequency, such as 100 MHz. The plurality of clock signals CK1 through CK3 are generated by the PLL 522. Also, the de-serializer 523 generates a recovery clock signal RXCLK. The output register 524 receives the plurality of parallel data signals CP1 through CPK and outputs the plurality of parallel data signals CP1 through CPK to the comparator 221 in synchronization with the recovery clock signal RXCLK. As a result, the parallel data signals CP1 through CPK with a low frequency are input to the comparator 221.

Referring to FIG. 4B, the output signal converter SDO1 includes a control register 540, a parallel converter 550, a first delay device 560, and a second delay device 570. The parallel converter 550 includes an input buffer 551, a PLL 552, a de-serializer 553, and an output register 554.

The output signal converter SDO1 of FIG. 4B is implemented in the same manner as the output signal converter SDO1 of FIG. 4A except for two differences. Accordingly, a detailed description for the configuration and operation of the output signal converter SDO1 of FIG. 4B is omitted except for the two differences.

A first difference is that the control register 540 further outputs a control signal PCTL3. A second difference is that the output signal converter SDO1 of FIG. 4B includes the first delay device 560 and the second delay device 570.

The first delay device 560 and the second delay device 570 are connected in series between the de-serializer 553 and the input buffer 551. The first delay device 560 sets a first delay time in response to the control signals PCTL2 and the second delay device 570 sets a second delay time in response to the control signal PCTL3. The first delay device 560 delays the serial data signal CPS1 received from the input buffer 551 by the first delay time. The first delay device 560 performs the same function as the delay device 530 of FIG. 4A. Accordingly, the detailed description for the operation of the first delay device 560 is omitted.

The second delay device 570 delays the delayed serial data signal CPS1 received from the first delay device 560 by the second delay time.

Here, the second delay times of the respective second delay devices 570 of the output signal converters SDO1 through SDOT are equal and can be changed as necessary. As a result, the times at which the serial data signals CPS1 through CPST are respectively input to each of the de-serializers 553 of the output signal converters SDO1 through SDOT, is shifted ahead or is delayed by the second delay device 570. Accordingly, as the second delay time is changed, a valid data margin on the output side of the semiconductor memory device 300 can be measured.

Next, a method of testing a high-frequency semiconductor memory device using the test apparatus, according to a sixth embodiment of the present invention, will be described with reference to FIGS. 2, 3B, 4B and 5.

Figure 5:
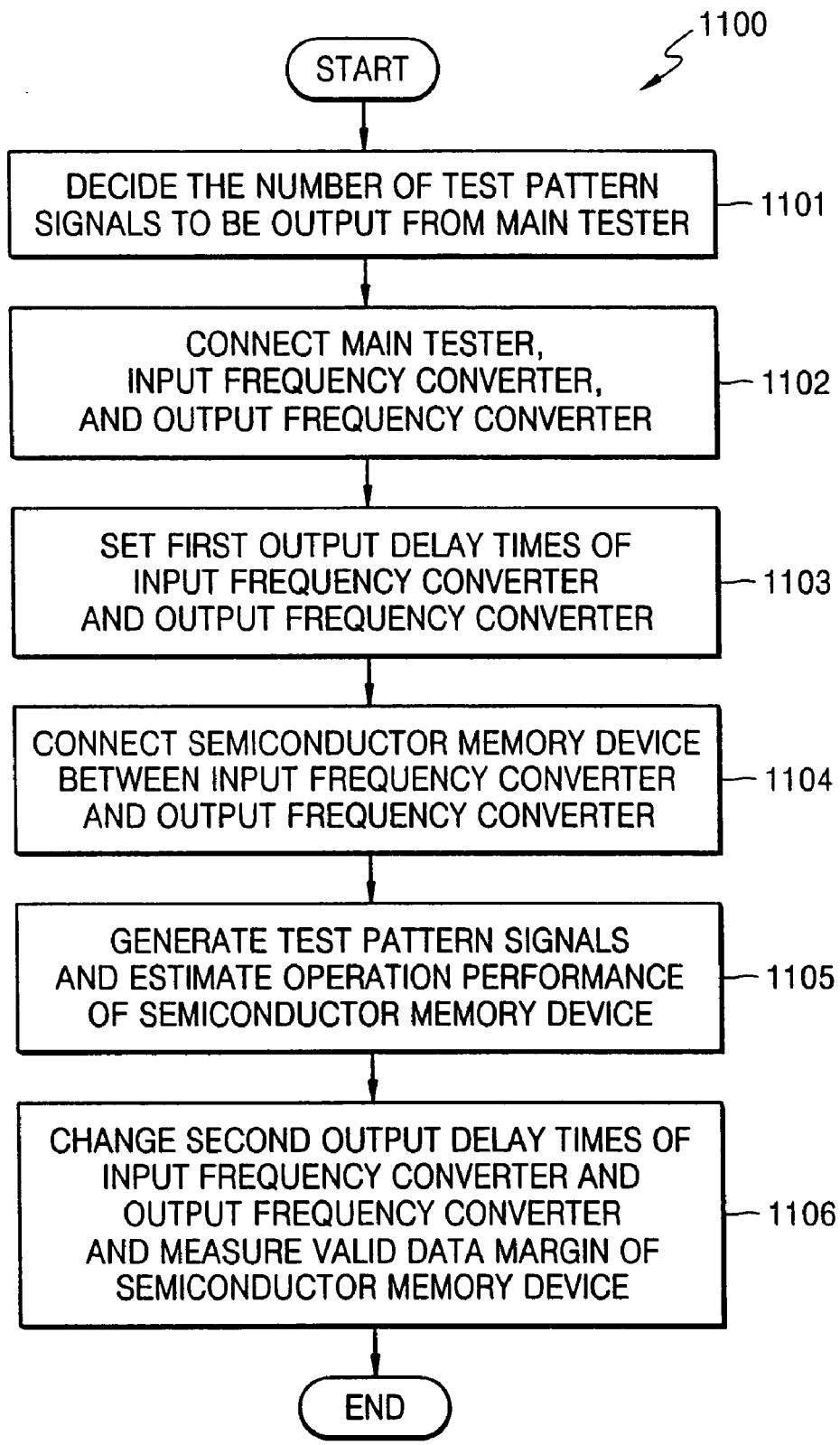
FIG. 5 is a flowchart illustrating a method of testing semiconductor memory devices using the apparatus of FIG. 2, according to a sixth embodiment of the present invention.

FIG. 5 is a flowchart illustrating a method of testing semiconductor memory devices using the test apparatus 200, according to a sixth embodiment of the present invention.

Referring to FIG. 5, the number of test pattern signals, that is, the number of parallel data signals DR1 through DRN, to be output from the main tester 201 is determined in step 1101. The main tester 201 is connected with the input frequency converter 202 and the output frequency converter 203 according to the decided number of the test pattern signals in step 1102.

More specifically, the number of the parallel data signals DR1 through DRN to be input to the input frequency converter 202 is determined according to an operating frequency of a semiconductor memory device 300 to be tested and the frequencies of the parallel data signals DR1 through DRN. Also, the number of the output signals of the output frequency converter 203 is equal to the number of the parallel data signals DR1 through DRN.

For example, it is assumed that the operating frequency of the semiconductor memory device 300 is 2.5 GHz and the main tester 201 outputs the parallel data signals DR1 through DRN at a frequency of 250 MHz.

The input pins DIP1 through DIPT of the input signal converters SDI1 through SDIT are connected to the output pins 216 of the main tester 201 so that 20 parallel data signals DR1 through DR20, . . . , DRM through DR(M+19) are respectively input to the input signal converters SDI1 through SDIT of the input frequency converter 202. Also, the output pins COP1 through COPT of the output signal converters SDO1 through SDOT are connected to the input pins 227 of the main tester 201 so that the output signal converters SDO1 through SDOT of the output frequency converter 203 output the 20 parallel data signals CP1 through CP20, . . . , CPM through CP(M+19), respectively.

Next, the main tester 201 sets first output delay times of the input frequency converter 202 and the output frequency converter 203 in step 1103. More specifically, in the main tester 201, the first controller 230 outputs the first CMOS signal CMOS1 in response to the first logic signal LOG1 received from the third format controller 253 of the logic signal generator 250. The respective control registers 440 of the input signal converters SDI1 through SDIT are programmed by the first CMOS signal CMOS1 and output a plurality of control signals SCTL1 through SCTL2. The first controller 230 outputs the first CMOS signal CMOS1 for each of the input signal converters SDI1 through SDIT.

That is, the first CMOS signal CMOS1 output from the first controller 230 includes an identification signal (hereinafter, referred to as ID signal) for each of the input signal converters SDI1 through SDIT. Accordingly, the plurality of input signal converters SDI1 through SDIT can be independently programmed by the first CMOS signal CMOS1.

The delay times of the respective first delay devices 460 of the input signal converters SDI1 through SDIT are set in response to the control signal SCTL2. The delay times of the first delay devices 460 are not necessarily set equally.

The second controller 240 of the main tester 201 outputs the second CMOS signal CMOS2 in response to the second logic signal LOG2 received from the third format controller 253. The second CMOS signal CMOS 2 output from the second controller 240 includes an ID signal for each of the output signal converters SDO1 through SDOT. Accordingly, the output signal converters SDO1 through SDOT can be independently programmed by the second CMOS signal CMOS2.

The respective control registers 540 of the output signal converters SDO1 through SDOT are programmed by the second CMOS signal CMOS2 and output a plurality of control signals PCTL1 through PCTL2. The delay times of the respective first delay devices 560 of the plurality of output signal converters SDO1 through SDOT are set in response to the control signal PCTL2. The delay times of the first delay devices 560 are not necessarily set equally.

Thereafter, the semiconductor memory device 300 is connected between the input frequency converter 202 and the output frequency converter 203 in step 1104. That is, the output pins DOP1 through DOPT of the plurality of input signal converters SDI1 through SDIT are connected to the input pins 301 of the semiconductor memory device 300 and the input pins CIP1 through CIPT of the plurality of output signal converters SDO1 through SDOT are connected to the output pins 302 of the semiconductor memory device 300.

The main tester 201 generates the test pattern signals, that is, the parallel data signals DR1 through DRK, . . . , DRM through DRN and outputs the test pattern signals to the plurality of input signal converters SDI1 through SDIT. Thereafter, the main tester 201 receives parallel data signals CP1 through CPK, . . . , CPM through CPN from the plurality of output signal converters SDO1 through SDOT and estimates an operating performance of the semiconductor memory device 300 in step 1105.

By changing second output delay times of the input frequency converter 202 and the output frequency converter 203, valid data margins of the input and output signals of the semiconductor memory device 300 are determined in step 1106.

That is, the respective control registers 440 of the input signal converters SDI1 through SDIT are programmed by the first CMOS signal CMOS1 and further output control signals SCTL3.

The second delay time of the respective second delay device 470 of each of the input signal converters SDI1 through SDIT is set in response to the control signal SCTL3. The second delay times of the second delay devices 470 are set equal in all of the input signal converters SDI1 through SDIT.

Also, the respective control registers 540 of the output signal converters SDO1 through SDOT are programmed by the second CMOS signal CMOS2 and further output control signals PCTL3. The delay times of the respective second device 570 of the plurality of output signal converters SDO1 through SDOT are set in response to the control signal PCTL3. The second delay times of the second delay devices 570 are set equal in all of the output signal converters SDO1 through SDOT.

Figure 6:
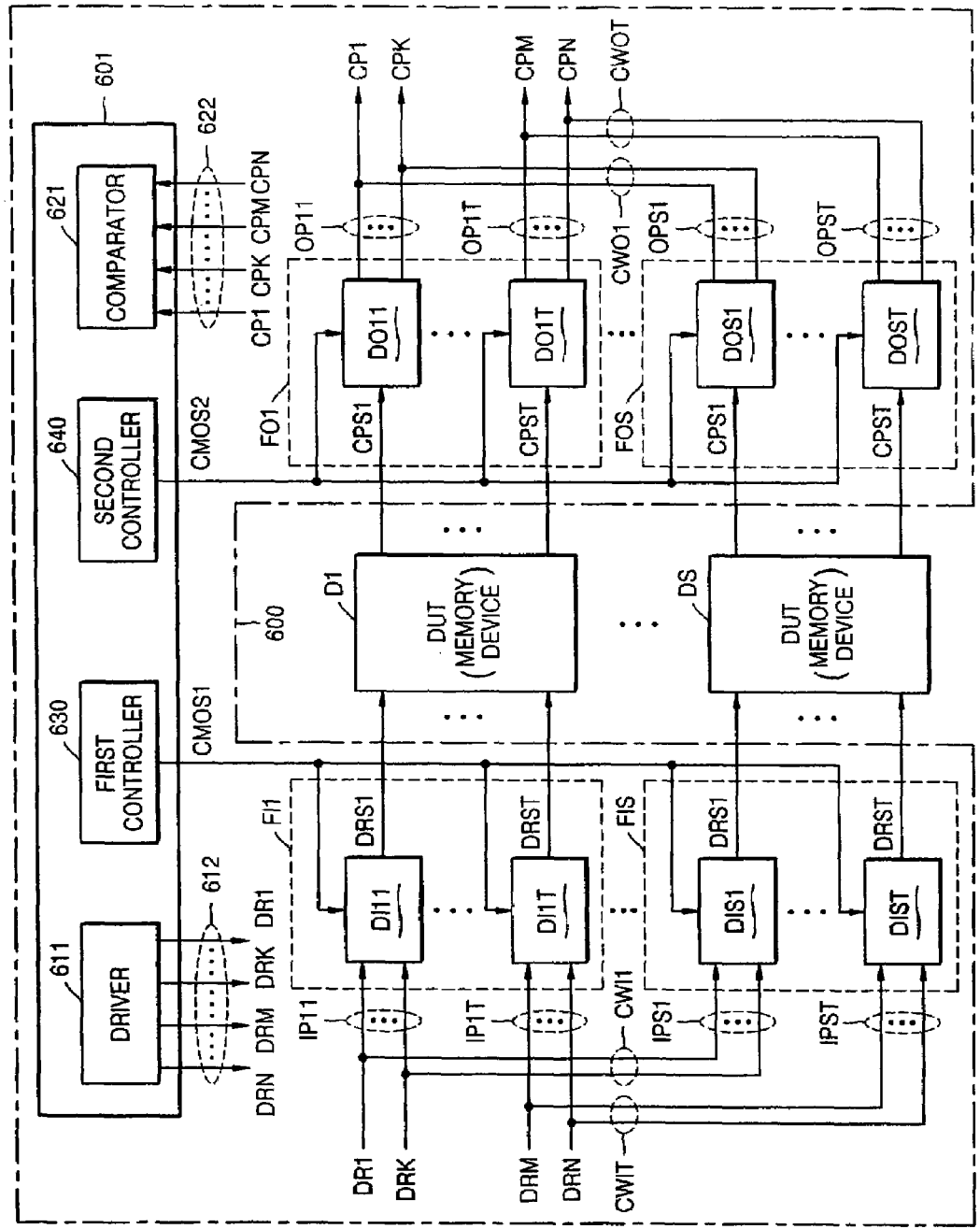
FIG. 6 is a block diagram of an apparatus that tests semiconductor memory devices, according to a seventh embodiment of the present invention and semiconductor memory devices.

FIG. 6 is a block diagram of a test apparatus 600 which selectively changes the frequencies of test pattern signals according to a seventh embodiment of the present invention and semiconductor memory devices D1 through DS.

In FIG. 6, the test apparatus 600 includes a main tester 601, a plurality of input frequency converters FI1 through FIS, and a plurality of output frequency converters FO1 through FOS. The configuration and operation of the main tester 601 is the same as those of the main tester 201 of FIG. 2, and therefore the detailed description thereof is omitted. Also, in FIG. 6, for convenience of the description, only a driver 611, a comparator 621, a first controller 630, and a second controller 640 are shown, while other components of the main tester 601 are omitted. Also, the first controller 630 and the second controller 640 implemented by CMOS signal generators in FIG. 6 can, however, be implemented by mode register set signal generators.

The first controller 630 and the second controller 640 output first and second CMOS signals CMOS1 and CMOS2 each including a clock signal SCK, a command signal CMD, and a data signal SIO.

The plurality of input frequency converters FI1 through FIS and the plurality of output frequency converters FO1 through FOS can be connected to the main tester 601 or separated therefrom. Also, the plurality of input frequency converters FI1 through FIS and the plurality of output frequency converters FO1 through FOS can be implemented by a single chip.

High frequency semiconductor memory devices D1 through DS to be tested are respectively connected between the plurality of input frequency converters FI1 through FIS and the plurality of output frequency converters FO1 through FOS.

The plurality of input frequency converters FI1 through FIS include a plurality of input signal converters DI11 through DI1T, . . . , DIS1 through DIST (T and S are integers greater than one), and the plurality of output frequency converters FO1 through FOS include a plurality of output signal converters DO11 through DO1T, . . . , DOS1 through DOST.

Input pins IP11 through IP1T, . . . , IPS1 through IPST of the input signal converters DI11 through DI1T, . . . , DIS1 through DIST are connected to output pins 612 of the driver 611 of the main tester 601 by external data lines CWI1 through CWIT.

The input signal converters DI11 through DI1T, . . . , DIS1 through DIST receive a plurality of parallel data signals DR1 through DRK, . . . , DRM through DRN from the driver 611. The input signal converters DI11 through DI1T, . . . , DIS1 through DIST convert the parallel data signals DR1 through DRK, . . . , DRM through DRN into a plurality of serial data signals DRS1 through DRST.

For example, the input signal converter DI11 converts the parallel data signals DR1 through DRK into a serial data signal DRS1.

The frequency of each of the serial data signals DRS1 through DRST is changed according to the number of the parallel data signals DR1 through DRK, . . . , DRM through DRN respectively input to the input signal converters DI11 through DI1T, . . . , DIS1 through DIST.

It is assumed that the main tester 601 outputs the plurality of parallel data signals DR1 through DRK, . . . , DRM through DRN at a frequency of 250 MHz. When 20 parallel data signals DR1 through DR20, . . . , DRM through DR(M+19) are input to each of the input signal converters DI11 through DI1T, . . . , DIS1 through DIST, the input signal converters DI11 through DI1T, . . . , DIS1 through DIST output the serial data signals DRS1 through DRST of 2.5 GHz.

Also, when 10 parallel data signals DR1 through DR10, . . . , DRM through DR(M+9) are input to each of the plurality of input signal converters DI11 through DI1T, . . . , DIS1 through DIST, the plurality of input signal converters DI11 through DI1T, . . . , DIS1 through DIST output the serial data signals DRS1 through DRST of 2.5 GHz.

As described above, the input signal converters DI11 through DI1T, . . . , DIS1 through DIST convert the parallel data signals DR1 through DRK, . . . , DRM through DRN with a low frequency into the serial data signals DRS1 through DRST with a high frequency.

The serial data signals DRS1 through DRST are input to the semiconductor memory devices D1 through DS, respectively. Each of the semiconductor memory devices D1 through DS output a plurality of serial data signals CPS1 through CPST in response to the serial data signals DRS1 through DRST.

Output pins OP11 through OP1T, . . . , OPS1 through OPST of the output signal converters DO11 through DO1T, . . . , DOS1 through DOST are connected to the input pins 622 of the comparator 621 of the main tester 601 by external data lines CWO1 through CWOT.

The output signal converters DO11 through DO1T, . . . , DOS1 through DOST convert the serial data signals with a high frequency received from the semiconductor memory devices D1 through DS into a plurality of parallel data signals CP1 through CPK, . . . , CPM through CPN with a low frequency. Each of the output signal converters DO11 through DO1T, . . . , DOS1 through DOST output the same number of parallel data signals as the number of signals input to each of the input signal converters DI11 through DI1T, . . . , DIS1 through DIST.

For example, the output signal converter DO11 converts the serial data signal CPS1 into the parallel data signals CP1 through CPK. If the input signal converter DI11 receives 10 parallel data signals DR1 through DR10, the output signal converter D011 outputs the 10 parallel data signals CP1 through CP10. As a result, the parallel data signals CP1 through CPK, . . . , CPM through CPN with a low frequency are input to the comparator 622.

Each of the input signal converters DI11 through DI1T, . . . , DIS1 through DIST is initialized in response to the first CMOS signal CMOS1 output from the first controller 630 and programmed by the first CMOS signal CMOS1 to be enabled or disabled, thereby setting an output delay time.

The first CMOS signal CMOS1 includes an ID (indentification) signal for each of the input signal converters DI11 through DI1T, . . . , DIS1 through DIST. Accordingly, the input signal converters DI11 through DI1T, . . . , DIS1 through DIST are independently programmed by the first CMOS signal CMOS1.

Each of the output signal converters DI11 through DI1T, . . . , DIS1 through DIST are initialized in response to the second CMOS signal CMOS2 output from the second controller 640 and programmed by the second CMOS signal CMOS2 to be enabled or disabled, thereby setting an output delay time.

The second CMOS signal CMOS2 includes an ID signal for each of the output signal converters DO11 through DO1T, . . . , DOS1 through DOST. Accordingly, the output signal converters DO11 through DO1T, . . . , DOS1 through DOST are independently programmed by the second CMOS signal CMOS2.

In FIG. 6, the first controller 630 and the input signal converters DI11 through DI1T, . . . , DIS1 through DIST connected to each other by a single line can however be connected through a plurality of lines respectively transmitting a clock signal SCK, a command signal CMD, and a data signal SIO, as the first CMOS signal CMOS1. Similarly, the second controller 640 and the output signal converters DO11 through DO1T, . . . , DOS1 through DOST can also be connected by a plurality of lines.

The configuration and operation of each of the input signal converters DI11 through DI1T, . . . , DIS1 through DIST are the same as those of the input signal converters SDI1 of FIGS. 3A and 3B, and therefore, a detailed description thereof are not repeated. Also, the configuration and operation of each of the output signal converters DO11 through DO1T, . . . , DOS1 through DOST are the same as those of the output signal converters SDO1 of FIGS. 4A and 4B, and therefore the detailed descriptions thereof are not repeated.

A method of testing the semiconductor memory devices D1 through DS using the test apparatus 600 described above will now be described with reference to FIGS. 6 through 8.

Figure 7:
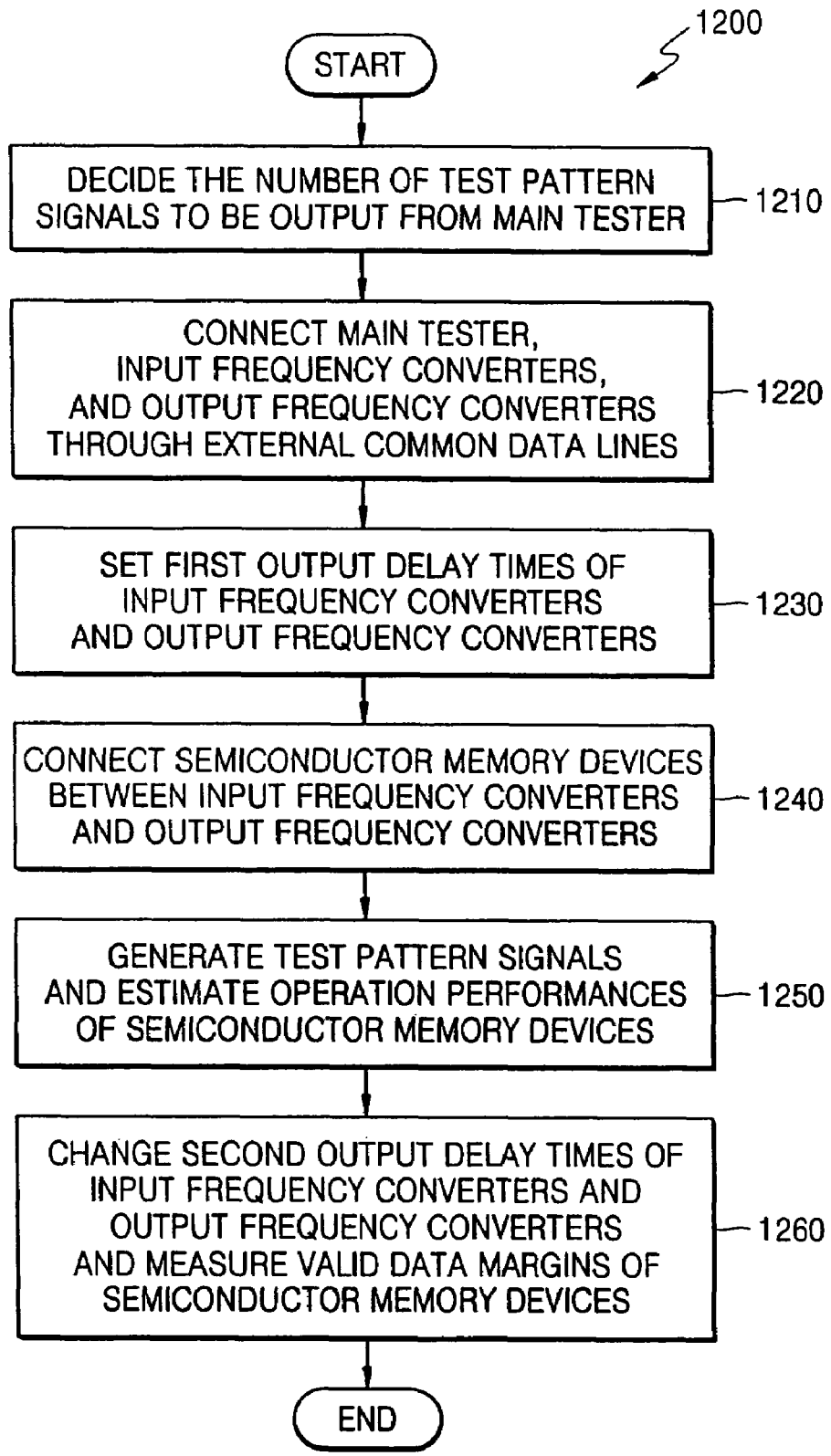
FIG. 7 is a flowchart illustrating a method of testing semiconductor memory devices using the apparatus of FIG. 6, according to an eighth embodiment of the present invention.
Figure 8:
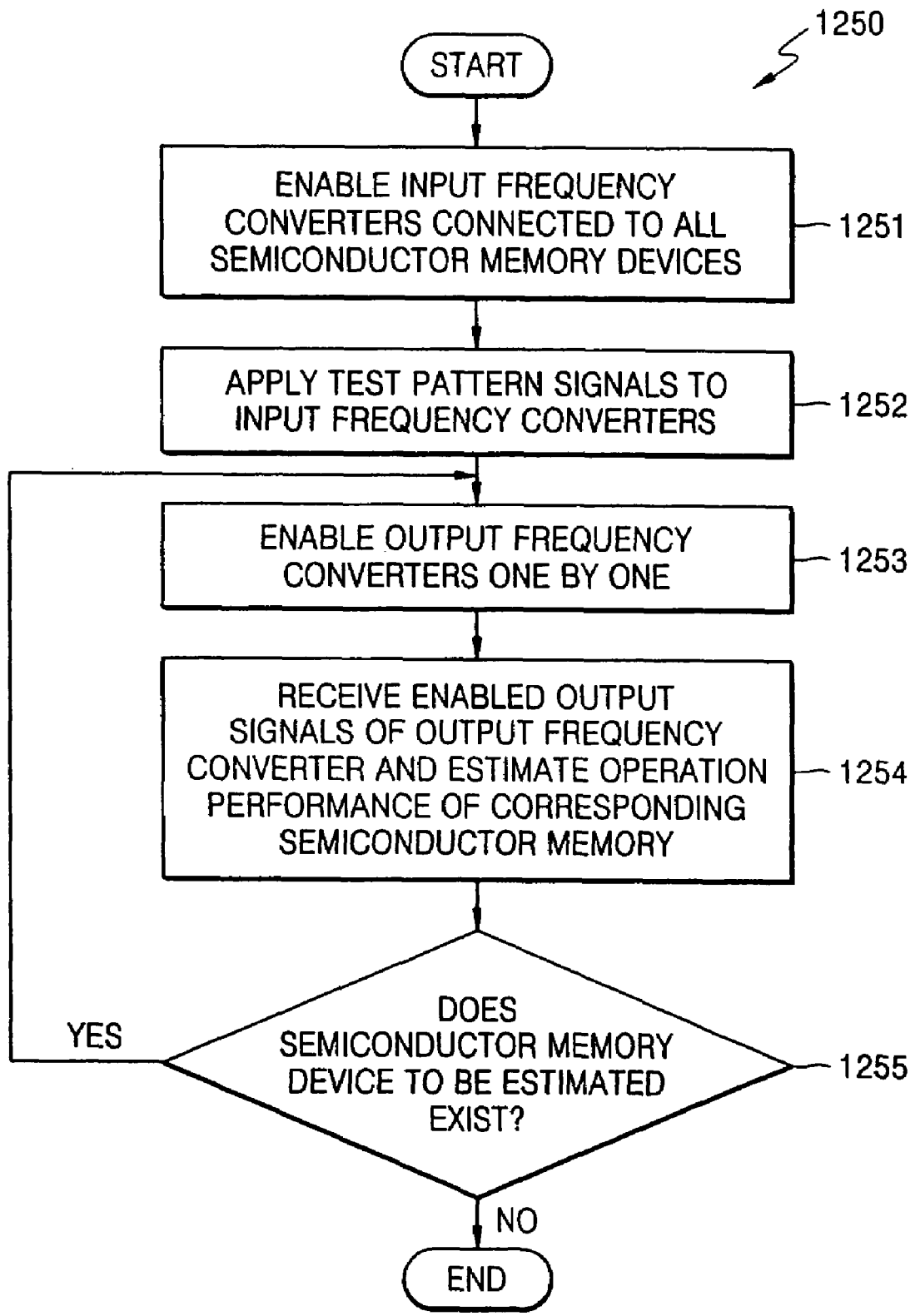
FIG. 8 is a flowchart illustrating a method of estimating operating performances of the semiconductor memory devices shown in FIG. 7.

FIG. 7 is a flowchart illustrating a method of testing semiconductor memory devices using the test apparatus that selectively changes the frequencies of the test pattern signals, according to an eighth embodiment of the present invention of FIG. 6. FIG. 8 is a flowchart illustrating a method of estimating operating performances of the semiconductor memory devices shown in FIG. 7.

Referring to FIG. 7, the number of test pattern signals, that is, the number of the parallel data signals DR1 through DRN to be output from the main tester 601, is determined in step 1210. The main tester 601, the input frequency converters FI1 through FIS, and the output frequency converters FO1 through FOS are connected to each other by the external data lines CWI1 through CWIT and CWO1 through CWOT according to the determined number of the parallel data signals DR1 through DRN in step 1220.

More specifically, the number of the parallel data signals DR1 through DRN to be input to each of the input frequency converters FI1 through FIS is determined according to the operating frequencies of the semiconductor memory devices D1 through DS to be tested and the frequencies of the parallel data signals DR1 through DRN.

Also, the number of the output signals of the output frequency converters FO1 through FOS is set equal to the number of the parallel data signals DR1 through DRN.

For example, it is assumed that the main tester 601 outputs the parallel data signals DR1 through DRN at 250 MHz. It is also assumed that the operating frequencies of the semiconductor memory devices D1 through DS are 2.5 GHz. Then, the input pins IP11 through IP1T, . . . , IPS1 through IPST of the input signal converters DI11 through DI1T, . . . , DIS1 through DIST are connected to the output pins 612 of the driver 611 of the main tester 601 by external data lines CWI1 through CWIT, so that 20 parallel data signals DR1 through DR20, are input to each of the input signal converters DI11 through DIS1 and 20 parallel data signals DRM through DR(M+19) are input to each of the input signal converters DI1T through DIST.

Also, the output pins OP11 through OP1T, . . . , OPS1 through OPST of the output signal converters DO11 through DO1T, . . . , DOS1 through DOST are connected to the input pins 622 of the comparator 621 of the main tester 601 so that each of the output signal converters DO11 through DOS1 outputs 20 parallel data signals CP1 through CP20 and each of the output signal converters DO1T through DOST outputs 20 parallel signals CPM through CP(M+19).

Next, the main tester 601 sets first output delay times of the input frequency converters FI1 through FIS and the output frequency converters FO1 through FOS in step 1230. More specifically, the first controller 630 of the main tester 601 outputs the first CMOS signal CMOS1. The respective input signal converters DI11 through DI1T, . . . , DIS1 through DIST of the input frequency converter FI1 through FIS are programmed by the first CMOS signal CMOS1, thereby setting the first output delay time.

The first output delay times of the input signal converters DI11 through DI1T, . . . , DIS1 through DIST are not necessarily set to be equal. As a result, the semiconductor memory devices D1 through DS simultaneously receive serial data signals DRS1 through DRST from the input signal converters DI11 through DI1T, . . . , DIS1 through DIST.

The first controller 630 outputs the first CMOS signal CMOS1 for each of the input signal converters DI11 through DI1T, . . . , DIS1 through DIST. That is, the first CMOS signal CMOS1 output from the first controller 630 includes an ID signal for each of the input signal converters DI11 through DI1T, . . . , DIS1 through DIST. Accordingly, the input signal converters DI11 through DI1T, . . . , DIS1 through DIST can be independently programmed by the first CMOS signal CMOS1.

The second controller 640 of the main tester 601 outputs the second CMOS signal CMOS2. The second CMOS signal CMOS2 includes an ID signal for each of the output signal converters DO11 through DO1T, . . . , DOS1 through DOST. Accordingly, the output signal converters D011 through DO1T, . . . , DOS1 through DOST can be independently programmed by the second CMOS signal CMOS2.

Each of the output signal converters DO11 through DO1T, . . . , DOS1 through DOST is programmed by the second CMOS signal CMOS2, thereby setting a first output delay time.

The first output delay times of the output signal converters DO11 through DO1T, . . . , DOS1 through DOST are not necessarily set to be equal. As a result, the plurality of output signal converters DO11 through DO1T, . . . , DOS1 through DOST simultaneously receive the serial data signals CPS1 through CPST from the semiconductor memory devices D1 through DS.

The semiconductor memory devices D1 through DS are then respectively connected between the input frequency converters FI1 through FIS and the output frequency converters FO1 through FOS in step 1240. For example, the output terminals of the input signal converters DI11 through DI1T of the input frequency converter FI1 are connected to the input terminals of the semiconductor memory device D1 and the input terminals of the output signal converters DO11 through DO1T of the output frequency converter FO1 are connected to the output terminals of the semiconductor memory device D1.

Thereafter, the main tester 601 generates test pattern signals, that is, the parallel data signals DR1 through DRK, . . . , DRM through DRN and determines the operating performances of the semiconductor memory devices D1 through DS in step 1250. Step 1250 will now be described in more detail with reference to FIG. 8.

First, the first controller 630 outputs the first CMOS signal CMOS1 and enables the input frequency converters FI1 through FIS connected to the semiconductor memory devices D1 through DS in step 1251. Then, the driver 611 outputs the test pattern signals, that is, the parallel data signals DR1 through DRK, . . . , DRM through DRN to the input frequency converters FI1 through FIS in step 1252. The parallel data signals DR1 through DRK, . . . , DRM through DRN are simultaneously input to the input frequency converters FI1 through FIS.

The parallel data signals DR1 through DRK, . . . , DRM through DRN with low frequencies are converted into serial data signals DRS1 through DRST with high frequencies by the input frequency converters FI1 through FIS. Each of the semiconductor memory devices D1 through DS outputs serial data signals CPS1 through CPST in response to the serial data signals DRS1 through DRST.

The serial data signals CPS1 through CPST are output to the output frequency converters FO1 through FOS, respectively. The output frequency converters FO1 through FOS respectively convert the serial data signals CPS1 through CPST with high frequencies into the parallel data signals CP1 through CPK, . . . , CPM through CPN with low frequencies.

Then, the second controller 640 outputs the second CMOS signal CMOS2 and enables each of the output frequency converters FO1 through FOS individually in step 1253. That is, when one of the output frequency converter FO1 through FOS is enabled, the remaining output frequency converters are disabled.

The main tester 601 receives the output signals of the enabled output frequency converters and determines the operating performance of a corresponding semiconductor memory device in step 1254. For example, when the output frequency converter FO1 is enabled, the main tester 601 receives the parallel data signals CP1 through CPK, . . . , CPM through CPN from the output frequency converter FO1 and compares the parallel data signals CP1 through CPK, . . . , CPM through CPN with reference signals, thereby measuring the performance of the semiconductor memory device D1. The main tester 601 determines whether a next semiconductor memory device to be estimated exists in step 1255. When the semiconductor memory device to be estimated exists in step 1255, the method is returned to step 1253, and when no next semiconductor memory device to be estimated exists, the method is terminated.

Referring to FIG. 7, by changing the second output delay times of the input frequency converters FI1 through FIS and the output frequency converters FO1 through FOS, valid data margins of the input and output signals of the semiconductor memory devices D1 through DS are determined in step 1260.

That is, the respective input signal converters DI11 through DI1T, . . . , DIS1 through DIST of the input frequency converters FI1 through FIS are respectively programmed by the first CMOS signal CMOS1, thereby setting the second output delay time.

The second output delay times of the input signal converters DI11 through DI1T, . . . , DIS1 through DIST are set to be equal. As a result, the times at which the semiconductor memory devices D1 through DS receive the serial data signals DRS1 through DRST can be changed simultaneously.

Also, the respective output signal converters DO11 through DO1T, . . . , DOS1 through DOST of the output frequency converters FO1 through FOS are respectively programmed by the second CMOS signal CMOS2, thereby simultaneously setting the second output delay time.

At this time, the second output delay times of the output signal converters DO11 through DO1T, . . . , DOS1 through DOST are set equally. As a result, the times at which the output signal converters DO11 through DO1T, . . . , DOS1 through DOST receive the serial data signals CPS1 through CPST output from the semiconductor memory devices D1 through DS, can be changed at the same time.

Similarly to step 1253, the input frequency converters FI1 through FIS are simultaneously enabled in response to the first CMOS signal CMOS1 and the output frequency converters FO1 through FOS are enabled singly in response to the second COMS signal CMOS2, in step 1254. As a result, the main tester 601 can measure a valid data margin for each semiconductor memory device.

Figure 9:
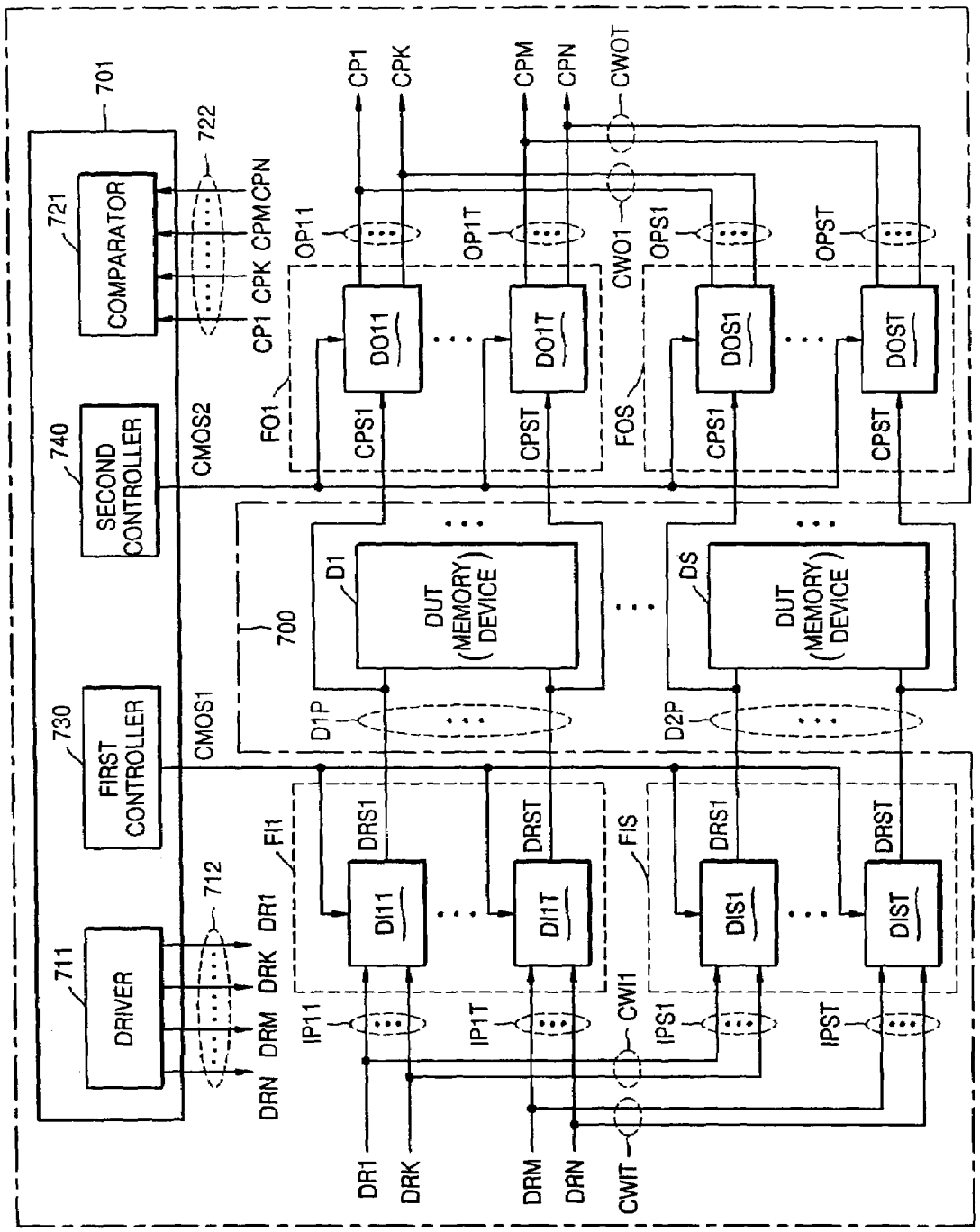
FIG. 9 is a block diagram of an apparatus that test semiconductor memory devices, according to a ninth embodiment of the present invention.

FIG. 9 is a block diagram of a test apparatus 700 that selectively changes the frequency of a test pattern signal and semiconductor memory devices D1 through DS, according to a ninth embodiment of the present invention.

Referring to FIG. 9, the test apparatus 700 includes a main tester 701, a plurality of input frequency converters FI1 through FIS, and a plurality of output frequency converters FO1 through FOS.

Here, the test apparatus 700 has the same configuration as the test apparatus 600 of FIG. 6 except for a few differences, and therefore, a detailed description for the configuration and operation of the test apparatus 700, except for the differences, is omitted.

When semiconductor memory devices D1 through DS to be tested have input/output pins having input/output functions, both the output terminals of the input frequency converters FI1 through FIS and the input terminals of the plurality of output frequency converters FO1 through FOS are connected to input/output pins D1P through DSP of the semiconductor memory devices D1 through DS.

As described above, the test apparatus and method according to exemplary embodiments of the present invention can test semiconductor memory devices with a high frequency by selectively changing the frequencies of test pattern signals.

Also, the test apparatus and method according to exemplary embodiments of the present invention can test semiconductor memory devices with various operating frequencies and can simultaneously test a plurality of semiconductor memory devices, thereby reducing testing costs.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An apparatus that tests a semiconductor memory device, the apparatus comprising:
   a main tester, which generates a plurality of first input test pattern signals with a first frequency, a first program control signal, and a second program control signal, receives a plurality of first output test pattern signals with the first frequency, and detects an operating performance of the semiconductor memory device;
   an input frequency converter, which converts the first input test pattern signals into a plurality of second input test pattern signals with a second frequency in response to the first program control signal, and outputs the second input test pattern signals to the semiconductor memory device; and an output frequency converter, which converts a plurality of second output test pattern signals with the second frequency received from the semiconductor memory device into the first output test pattern signals in response to the second program control signal, and outputs the first output test pattern signals.

2. The apparatus of claim 1, wherein the first input test pattern signals are first parallel data signals and the second input test pattern signals are first serial data signals, the input frequency converter includes a plurality of input signal converters, each of which receives a predetermined number of the first parallel data signals and outputs one of the first serial data signals, the first output test pattern signals are second parallel data signals and the second output test pattern signals are second serial data signals, and the output frequency converter includes a plurality of output signal converters, each of which receives one of the second serial data signals and outputs a predetermined number of the second parallel data signals.

3. An apparatus that tests a semiconductor memory device, the apparatus comprising:

a main tester, which generates a plurality of first input test pattern signals with a first frequency, a first program control signal, and a second program control signal receives a plurality of first output test pattern signals with the first frequency, and detects an operating performance of the semiconductor memory device;

an input frequency converter, which converts the first input test pattern signals into a plurality of second input test pattern signals with a second frequency in response to the first program control signal, and outputs the second input test pattern signals to the semiconductor memory device, wherein the first input test pattern signals are first parallel data signals and the second input test pattern signals are first serial data signals, the input frequency converter includes a plurality of input signal converters, each of which receives a predetermined number of the first parallel data signals and outputs one of the first serial data signals, and the first output test pattern signals are second parallel data signals and the second output test pattern signals are second serial data signals, and wherein each of the plurality of input signal converters comprises:

a control register, which is programmed in response to the first program control signal and outputs first and second control signals;

a serial converter, which is enabled or disabled in response to the first control signal, converts the predetermined number of the first parallel data signals into the one of the first serial data signals when the serial converter is enabled, and outputs one of the first serial data signals; and a first delay device, which sets a first delay time in response to the second control signal, delays the one of the first serial data signals by the first delay time, and outputs the delayed one of the first serial data signals; and an output frequency converter, which converts a plurality of second output test pattern signals with the second frequency received from the semiconductor memory device into the first output test pattern sianals in response to the second program control signal, and outputs the first output test pattern signals, wherein the output frequency converter includes a plurality of output signal converters, each of which receives one of the second serial data signals and outputs a predetermined number of the second parallel data signals.

4. The apparatus of claim 3, wherein the first delay times of the first delay devices are not necessarily set the same for all of input signal converters.

5. The apparatus of claim 4, wherein the control register further outputs a third control signal, and each of the input signal converters further includes a second delay device that sets a second delay time in response to the third control signal, delays the delayed one of the first serial data signals by the second delay time, and outputs the twice delayed one of the first serial data signals.

6. The apparatus of claim 5, wherein the second delay time of the second delay device is equal for all of the input signal converters.

7. The apparatus of claim 6, wherein the number of the first parallel data signals to be input to each of the input signal converters is determined according to a frequency of the first parallel data signals and an operating frequency of the semiconductor memory device to be tested.

8. The apparatus of claim 7, wherein the first program control signal includes an identification signal for each of the input signal converters.

9. An apparatus that tests a semiconductor memory device, the apparatus comprising:

a main tester, which generates a plurality of first input test pattern signals with a first frequency, a first program control signal, and a second program control signal, receives a plurality of first output test pattern signals with the first frequency, and detects an operating performance of the semiconductor memory device;

an input frequency converter, which converts the first input test pattern signals into a plurality of second input test pattern signals with a second frequency in response to the first program control signal, and outputs the second input test pattern signals to the semiconductor memory device, wherein the first input test pattern signals are first parallel data signals and the second input test pattern signals are first serial data signals, the input frequency converter includes a plurality of input signal converters, each of which receives a predetermined number of the first parallel data signals and outputs one of the first serial data signals, and the first output test pattern signals are second parallel data signals and the second output test pattern signals are second serial data signals, and an output frequency converter, which converts a plurality of second output test pattern signals with the second frequency received from the semiconductor memory device into the first output test pattern signals in response to the second program control signal, and outputs the first output test pattern signals, wherein the output frequency converter includes a plurality of output signal converters, each of which receives one of the second serial data signals and outputs a predetermined number of the second parallel data signals, wherein each of the plurality of output signal converters comprises:

a control register, which is programmed in response to the second program control signal and outputs first and second control signals;

a first delay device, which sets a first delay time in response to the second control signal, delays the one of the second serial data signals by the first delay time, and outputs the delayed one of the second serial data signals; and a parallel converter, which is enabled or disabled in response to the first control signal, converts the one of the second serial data signals received from the first delay device into a predetermined number of the second parallel data signals when the parallel converter is enabled, and outputs the converted result.

10. The apparatus of claim 9, wherein the first delay times of the first delay devices are not necessarily the same for all of output signal converters.

11. The apparatus of claim 10, wherein the control register further outputs a third control signal, and each of the input signal converters further includes a second delay device that sets a second delay time in response to the third control signal, delays the delayed one of the second serial data signals by the second delay time, and outputs the twice delayed one of the second serial data signals.

12. The apparatus of claim 11, wherein the second delay time of the second delay device is equal for all of the output signal converters.

13. The apparatus of claim 12, wherein the number of the second parallel data signals to be output from each of the output signal converters is determined according to a frequency of the second parallel data signals and an operating frequency of the semiconductor memory device to be tested.

14. The apparatus of claim 13, wherein the second program control signal includes an identification signal for each of the output signal converters.

15. An apparatus that tests a semiconductor memory device, the apparatus comprising:

a main tester, which generates a plurality of first input test pattern signals with a first frequency, a first program control signal, and a second program control signal, receives a plurality of first output test pattern signals with the first frequency, and detects an operating performance of the semiconductor memory device, wherein the main tester comprises:

a test signal generator, which generates the first input test pattern signals;

a defect analyzer, which receives the first output test pattern signals and detects the operating performance of the semiconductor memory device;

a logic signal generator, which generates a first logic signal and a second logic signal;

a first controller, which outputs the first program control signal in response to the first logic signal; and a second controller, which outputs the second program control signal in response to the second logic signal;

an input frequency converter, which converts the first input test pattern signals into a plurality of second input test pattern signals with a second frequency in response to the first program control signal, and outputs the second input test pattern signals to the semiconductor memory device, wherein the first input test pattern signals are first parallel data signals and the second input test pattern signals are first serial data signals, the input frequency converter includes a plurality of input signal converters, each of which receives a predetermined number of the first parallel data signals and outputs one of the first serial data signals, and the first output test pattern signals are second parallel data signals and the second output test pattern signals are second serial data signals, and an output frequency converter, which converts a plurality of second output test pattern signals with the second frequency received from the semiconductor memory device into the first output test pattern signals in response to the second program control signal, and outputs the first output test pattern signals, wherein the output frequency converter includes a plurality of output signal converters, each of which receives one of the second serial data signals and outputs a predetermined number of the second parallel data signals.

16. The apparatus of claim 15, wherein the first controller and the second controller are mode register set signal generators.

17. The apparatus of claim 15, wherein the first controller and the second controller are CMOS signal generators.

18. An apparatus for testing a plurality of semiconductor memory devices, the apparatus comprising:

a main tester, which generates a plurality of first input test pattern signals with a first frequency, a first program control signal, and a second program control signal, receives a plurality of first output test pattern signals with the first frequency, and detects operating performances of the semiconductor memory devices;

a plurality of input frequency converters, which convert the first input test pattern signals into a plurality of second input test pattern signals with a second frequency in response to the first program control signal and output the second input test pattern signals to the semiconductor memory devices; and a plurality of output frequency converters, which convert a plurality of second output test pattern signals with the second frequency received from the semiconductor memory devices into the first output test pattern signals in response to the second program control signal and output the first output test pattern signals, wherein the input frequency converters are simultaneously enabled in response to the first program control signal, and when one of the output frequency converters is enabled in response to the second program control signal, the remaining output frequency converters are disabled.

19. A method of testing a semiconductor memory device comprising:

(a) determining a number of first input test pattern signals to be generated;

(b) connecting a main tester, an input frequency converter, and an output frequency converter, according to the determined number of the first input test pattern signals;

(c) generating a first program control signal and the second program control signal and setting first output delay times of the input frequency converter and the output frequency converter;

(d) connecting the semiconductor memory device between the input frequency converter and the output frequency converter; and (e) generating the first input test pattern signals, receiving first output test pattern signals, and determining an operating performance of the semiconductor memory device.

20. A method of testing a plurality of semiconductor memory devices comprising:

(a) determining a number of the first input test pattern signals to be generated;
(b) connecting a main tester, input frequency converters and output frequency converters by external data lines according to the determined number of the first input test pattern signals;
(c) generating a first program control signal and a second program control signal and setting first output delay times of the input frequency converters and the output frequency converters;
(d) connecting the semiconductor memory devices between the respective input frequency converters and output frequency converters; and
(e) generating the first input test pattern signals, receiving first output test pattern signals, and determining an operating performance of each of the semiconductor memory devices.

21. A method of testing a plurality of semiconductor memory devices comprising:
(a) determining a number of the first input test pattern signals to be generated;
(b) connecting a main tester, input frequency converters and output frequency converters by external data lines according to the determined number of the first input test pattern signals;
(c) generating a first program control signal and a second program control signal and setting first output delay times of the input frequency converters and the output frequency converters;
(d) connecting the semiconductor memory devices between the respective input frequency converters and output frequency converters; and
(e) generating the first input test pattern signals, receiving first output test pattern signals, and determining an operating performance of each of the semiconductor memory devices, wherein step (e) comprises:
  (e1) generating the first program control signal, thereby enabling all of the input frequency converters;
  (e2) inputting the first input test pattern signals to the input frequency converters;
  (e3) generating the second program control signal, thereby enabling the output frequency converters individually;
  (e4) receiving the first output test pattern signals from the enabled output frequency converter and determining an operating performance of a corresponding semiconductor memory device; and
  (e5) repeating steps (e3) and (e4) until all semiconductor memory devices are tested.

* * * * *

UNITED STATES PATENT AND TRADEMARK OFFICE
CERTIFICATE OF CORRECTION

PATENT NO. : 7,222,273 B2  Page 1 of 1
APPLICATION NO. : 10/886074
DATED : May 22, 2007
INVENTOR(S) : Sung-bum Cho It is certified that error appears in the above-identified patent and that said Letters Patent is hereby corrected as shown below:

Column 19, line 28 insert --,-- after the second occurrence of "signal"

Column 19, line 65 delete "sianals" and insert --signals--

Signed and Sealed this

Sixteenth Day of December, 2008

JON W. DUDAS
*Director of the United States Patent and Trademark Office*